US008598720B2

(12) United States Patent
Tomita et al.

(10) Patent No.: US 8,598,720 B2
(45) Date of Patent: Dec. 3, 2013

(54) SEMICONDUCTOR DEVICE AND MANUFACTURING METHOD THEREOF

(75) Inventors: Hiroaki Tomita, Ota (JP); Kazuyuki Sutou, Ashikaga (JP)

(73) Assignees: SANYO Semiconductor Co., Ltd., Gunma (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 135 days.

(21) Appl. No.: 12/575,687

(22) Filed: Oct. 8, 2009

(65) Prior Publication Data

US 2010/0102460 A1  Apr. 29, 2010

(30) Foreign Application Priority Data

Oct. 23, 2008  (JP) .................. 2008-273229

(51) Int. Cl.
*H01L 29/40* (2006.01)
(52) U.S. Cl.
USPC .............. 257/786; 257/E23.023; 257/E21.59; 257/E21.237; 438/113; 438/612
(58) Field of Classification Search
USPC ....... 438/612, 113; 257/786, E23.023, 21.59, 257/E21.237
See application file for complete search history.

(56) References Cited

U.S. PATENT DOCUMENTS

| | | | |
|---|---|---|---|
| 5,122,856 A | 6/1992 | Komiya | |
| 5,606,198 A * | 2/1997 | Ono et al. ...................... | 257/666 |
| 5,923,995 A * | 7/1999 | Kao et al. ....................... | 438/460 |
| 6,153,448 A * | 11/2000 | Takahashi et al. ............. | 438/114 |
| 6,656,758 B1 * | 12/2003 | Shinogi et al. .................. | 438/33 |
| 6,781,244 B2 * | 8/2004 | Prabhu ........................... | 257/778 |
| 7,067,354 B2 * | 6/2006 | Prabhu ........................... | 438/113 |
| 7,102,238 B2 * | 9/2006 | Noma et al. .................... | 257/777 |
| 7,241,679 B2 * | 7/2007 | Kameyama et al. ........... | 438/612 |
| 7,374,972 B2 * | 5/2008 | Kwon et al. .................... | 438/113 |
| 7,397,134 B2 * | 7/2008 | Noma ............................ | 257/778 |
| 7,435,621 B2 * | 10/2008 | Yang .............................. | 438/110 |
| 7,456,083 B2 * | 11/2008 | Noma et al. .................... | 438/460 |
| 7,557,017 B2 * | 7/2009 | Yamada et al. ................. | 438/462 |
| 7,728,445 B2 * | 6/2010 | Nakamura et al. ............ | 257/790 |
| 7,790,506 B2 * | 9/2010 | Fukuda .......................... | 438/113 |
| 7,795,115 B2 * | 9/2010 | Kameyama et al. ........... | 438/460 |
| 7,795,126 B2 * | 9/2010 | Prabhu et al. .................. | 438/612 |

(Continued)

FOREIGN PATENT DOCUMENTS

| | | |
|---|---|---|
| CN | 1753153 | 3/2006 |
| JP | 1-129441 | 5/1989 |
| JP | 2005-72554 | 3/2005 |
| JP | 2005-311117 | 11/2005 |

*Primary Examiner* — N Drew Richards
*Assistant Examiner* — Ankush Singal
(74) *Attorney, Agent, or Firm* — Morrison & Foerster LLP (57) ABSTRACT

A semiconductor device and its manufacturing method are offered to increase the number of semiconductor devices obtained from a semiconductor wafer while simplifying a manufacturing process. After forming a plurality of pad electrodes in a predetermined region on a top surface of a semiconductor substrate, a supporter is bonded to the top surface of the semiconductor substrate through an adhesive layer. Next, an opening is formed in the semiconductor substrate in a region overlapping the predetermined region. A wiring layer electrically connected with each of the pad electrodes is formed in the opening. After that, a stacked layer structure including the semiconductor substrate and the supporter is cut by dicing along a dicing line that is outside the opening.

12 Claims, 9 Drawing Sheets

(56) References Cited

U.S. PATENT DOCUMENTS

| | | | |
|---|---|---|---|
| 7,897,509 B2* | 3/2011 | Tanaka et al. | 438/637 |
| 7,919,875 B2* | 4/2011 | Noma et al. | 257/783 |
| 7,944,015 B2* | 5/2011 | Kitagawa et al. | 257/435 |
| 7,986,021 B2* | 7/2011 | Okada et al. | 257/436 |
| 8,148,254 B2* | 4/2012 | Kazama | 438/612 |
| 2002/0013061 A1* | 1/2002 | Siniaguine et al. | 438/706 |
| 2002/0016024 A1* | 2/2002 | Thomas | 438/113 |
| 2002/0055265 A1* | 5/2002 | Ring | 438/714 |
| 2003/0230805 A1* | 12/2003 | Noma et al. | 257/737 |
| 2004/0087130 A1* | 5/2004 | Kazama et al. | 438/613 |
| 2004/0115902 A1* | 6/2004 | Hanaoka | 438/460 |
| 2004/0137701 A1* | 7/2004 | Takao | 438/461 |
| 2004/0137723 A1* | 7/2004 | Noma et al. | 438/667 |
| 2004/0161920 A1* | 8/2004 | Noma | 438/620 |
| 2004/0235270 A1* | 11/2004 | Noma et al. | 438/460 |
| 2005/0003649 A1* | 1/2005 | Takao | 438/612 |
| 2005/0009238 A1* | 1/2005 | Okigawa | 438/119 |
| 2005/0176235 A1* | 8/2005 | Noma et al. | 438/614 |
| 2005/0194670 A1* | 9/2005 | Kameyama et al. | 257/678 |
| 2005/0208735 A1* | 9/2005 | Noma et al. | 438/460 |
| 2005/0269696 A1* | 12/2005 | Ochiai | 257/734 |
| 2005/0269698 A1* | 12/2005 | Okada et al. | 257/737 |
| 2006/0024949 A1* | 2/2006 | Yamada et al. | 438/622 |
| 2006/0068572 A1* | 3/2006 | Noma et al. | 438/577 |
| 2006/0079025 A1* | 4/2006 | Kripesh et al. | 438/113 |
| 2006/0270093 A1* | 11/2006 | Noma et al. | 438/64 |
| 2007/0026639 A1* | 2/2007 | Noma et al. | 438/459 |
| 2007/0166957 A1* | 7/2007 | Kameyama et al. | 438/459 |
| 2007/0210437 A1* | 9/2007 | Noma et al. | 257/690 |
| 2008/0135967 A1* | 6/2008 | Kitagawa et al. | 257/434 |
| 2008/0171421 A1* | 7/2008 | Suzuki et al. | 438/459 |
| 2008/0203557 A1* | 8/2008 | Yamamoto et al. | 257/700 |
| 2008/0217743 A1* | 9/2008 | Kojima et al. | 257/620 |
| 2008/0277793 A1* | 11/2008 | Noma et al. | 257/758 |
| 2009/0015285 A1* | 1/2009 | Farooq et al. | 324/763 |
| 2009/0026610 A1* | 1/2009 | Kitagawa et al. | 257/737 |
| 2009/0095974 A1* | 4/2009 | Taguchi et al. | 257/99 |
| 2010/0038668 A1* | 2/2010 | Noma | 257/98 |
| 2010/0038742 A1* | 2/2010 | Morita et al. | 257/499 |

* cited by examiner

SEMICONDUCTOR DEVICE AND MANUFACTURING METHOD THEREOF

CROSS-REFERENCE OF THE INVENTION

This application claims priority from Japanese Patent Application No. 2008-273229, the content of which is incorporated herein by reference in its entirety.

BACKGROUND OF THE INVENTION

1. Field of the Invention

This invention relates to a semiconductor device and its manufacturing method, specifically to a chip size package and its manufacturing method.

2. Description of the Related Art

A CSP (Chip Size Package) has received attention in recent years as a new packaging technology. The CSP means a small package having about the same outside dimensions as those of a semiconductor die packaged in it.

A BGA (Ball Grid Array) type semiconductor device is known as a kind of chip size package device. An example structure of the BGA type semiconductor device is described hereafter.

Figure 14:
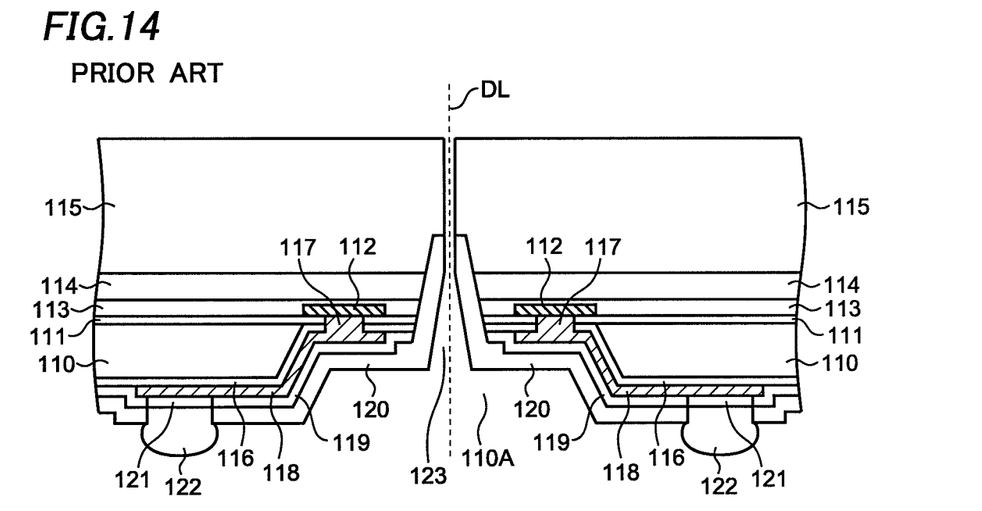
FIG. 14 is a cross-sectional view showing a conventional semiconductor device and its manufacturing method.

A pad electrode 112 is disposed on an insulation film 111 disposed on a top surface of a semiconductor substrate 110 that constitutes the semiconductor device, as shown in a cross-sectional view of FIG. 14. The pad electrode 112 is connected with an electronic device (not shown) formed in the semiconductor substrate 110. The pad electrode 112 is covered with an insulation film 113 that makes a passivation film. A supporter 115 is bonded to the top surface of the semiconductor substrate 110 through an adhesive layer 114.

On the other hand, an opening 110A is formed from a back surface of the semiconductor substrate 110 in a region overlapping the pad electrode 112 and a dicing line DL. An insulation film 116 is formed in an inside of the opening 110A and over the back surface of the semiconductor substrate 110. An opening 117 that exposes a portion of the pad electrode 112 is formed in the insulation films 111 and 116 that overlap the pad electrode 112. On the insulation film 116, there is disposed a wiring layer 118 that is connected with the pad electrode 112 through the opening 117. The wiring layer 118 is covered with an insulation film 119 and a protection film 120. An opening that exposes a portion of the wiring layer 118 is provided in the insulation film 119 and the protection film 120 that overlap the wiring layer 118. A plating layer 121 made of gold plating, for example, is disposed on the wiring layer 118 in the opening. A bump electrode 122 is disposed on the plating layer 121.

A groove 123 extending partway through a thickness of the supporter 115 is formed along the dicing line DL in the opening 110A in the semiconductor substrate. The protection film 120 covers the groove 123. The structure as described above eliminates a possibility that a damaged layer which allows invasion of water or the like to corrode the pad electrode 112 in the semiconductor device after dicing is caused on a side surface of the semiconductor substrate 110. Also, there can be prevented a connection failure between the pad electrode 112 and the wiring layer 118 due to an impact caused when a dicing blade touches the semiconductor substrate 110.

Figure 15:
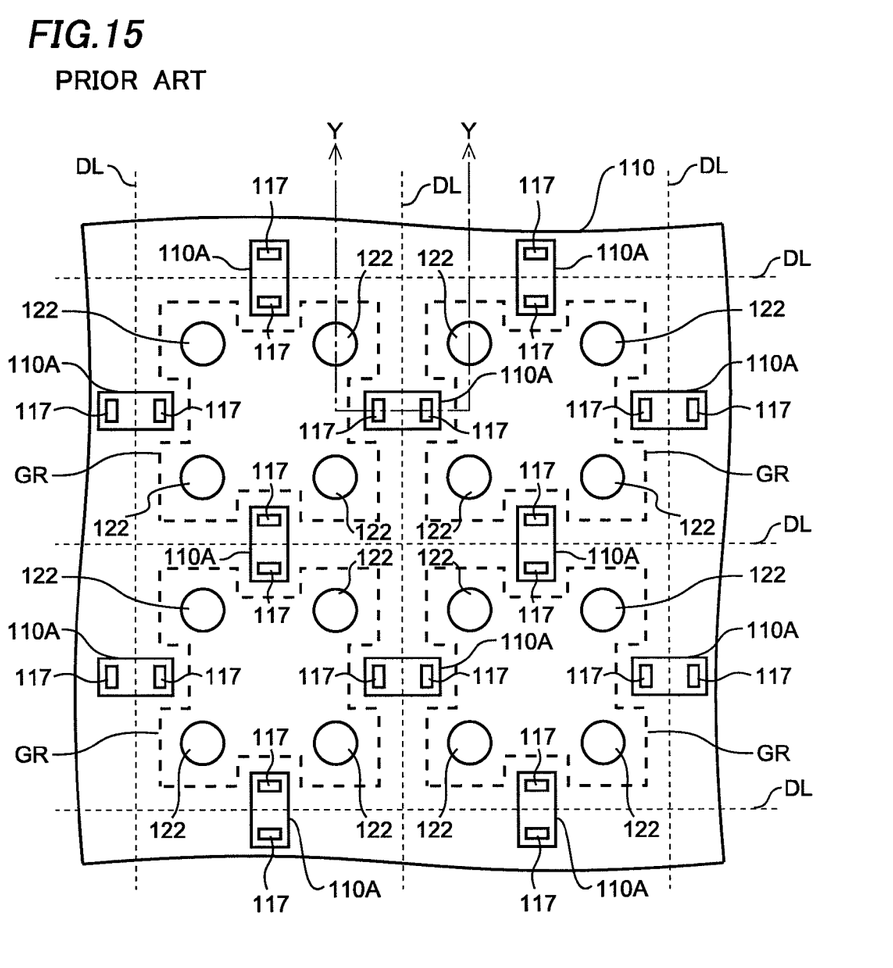
FIG. 15 is a cross-sectional view showing the conventional semiconductor device and its manufacturing method.

The structure described above looks as shown in FIG. 15 when looked from a back surface-side of the semiconductor substrate 110. A cross-sectional view of a section Y-Y in FIG. 15 corresponds to FIG. 14. FIG. 15 shows only the semiconductor substrate 110, the openings 110A, the openings 117, the bump electrodes 122 and the dicing lines DL out of the components shown in FIG. 14, and the rest of the components are omitted for the sake of convenience of the explanation.

The BGA type semiconductor device is described in Japanese Patent Application Publication No. 2005-72554, for example.

As described above, there is a need to secure a region corresponding to a width of the groove 123 between a pair of the pad electrodes 112 astride the dicing line DL in order to prevent the corrosion of the pad electrode 112 and the connection failure between the pad electrode 112 and the wiring layer 118, when the groove 123 is formed along the dicing line DL and covered with the protection film 120. That is, the conventional semiconductor device requires an additional area of the semiconductor substrate 110 to form each of the semiconductor devices. As a result, the number of the semiconductor devices obtained from a wafer form of the semiconductor substrate 110 has been reduced. In addition, the forming of the groove 123 has made the manufacturing process of the semiconductor device more complicated to increase the manufacturing cost. Furthermore, the reliability of the semiconductor device has been reduced because the pad electrodes 112 are disposed outside a guard ring GR that protects internal components by surrounding them.

SUMMARY OF THE INVENTION

The invention provides a semiconductor device that includes a semiconductor substrate having an opening formed therein, a supporter bonded to the top surface of the semiconductor substrate so as to cover the opening, an adhesive layer boding the supporter to the top surface of the semiconductor substrate, a plurality of pad electrodes disposed in the opening so as to be on the supporter, and a plurality of wiring layers electrically connected to corresponding pad electrodes in the opening. The supporter and the adhesive layer may be replaced with an insulation film.

The invention also provides a method of manufacturing a semiconductor device. The method includes providing a semiconductor substrate, forming a plurality of pad electrodes in a predetermined region on a top surface of the semiconductor substrate, bonding a supporter to the top surface of the semiconductor substrate using an adhesive, forming an opening in the semiconductor substrate at the predetermined region so as to penetrate through the semiconductor substrate, forming a plurality of wiring layers on a bottom surface of the semiconductor substrate so that the wiring layers are electrically connected to corresponding pad electrodes in the opening, and dicing a stacked layer structure comprising the semiconductor substrate and the supporter along a dicing line to produce a semiconductor device so that the opening remains in the produced semiconductor device without being cut through.

The invention further provides a semiconductor device that includes a semiconductor substrate having a front surface and a back surface and having an opening penetrating through the semiconductor substrate, an insulating body disposed on the front surface of the semiconductor substrate and covering the opening of the semiconductor substrate, a plurality of pad electrodes disposed in the opening of the semiconductor substrate so as to be on the insulating body, and a plurality of wiring layers electrically connected to corresponding pad electrodes and disposed on the back surface of the semiconductor substrate. In plan view of the semiconductor device, the wiring layers extend radially from the opening of the semiconductor substrate toward corresponding edges of the semiconductor substrate.

DETAILED DESCRIPTION OF THE INVENTION

Figure 1:
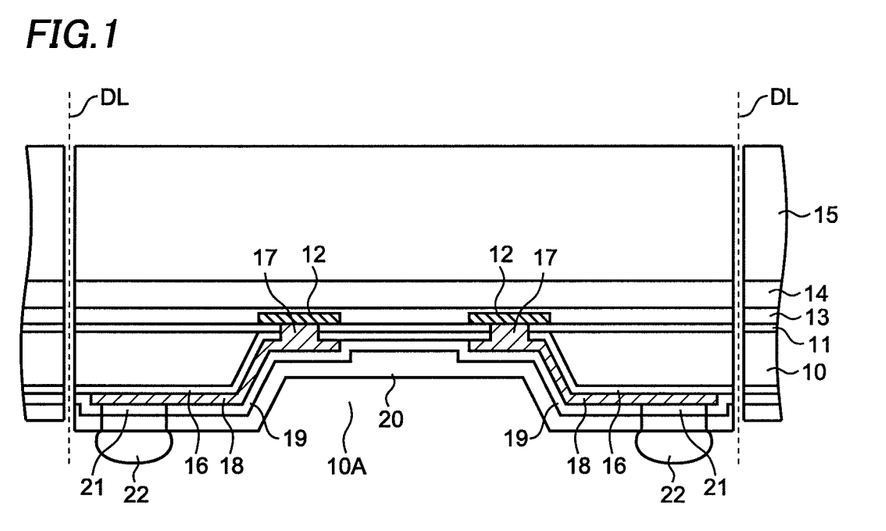
FIG. 1 is a cross-sectional view showing a semiconductor device and its manufacturing method according to an embodiment of this invention.

A semiconductor device according to an embodiment of this invention is hereafter described referring to the drawings. First, a structure of the semiconductor device will be described. FIG. 1 is a cross-sectional view showing the semiconductor device and its manufacturing method. FIG. 1 primarily shows one semiconductor device out of a plurality of the semiconductor devices formed in a wafer form of a semiconductor substrate 10. The cross-sectional view shown in FIG. 1 corresponds to a section X-X in an outline plan view shown in FIG. 2.

An insulation film 11 made of a BPSG (Boro-Phospho Silicate Glass) film or the like is disposed on a top surface of the semiconductor substrate 10 constituting the semiconductor device, and a plurality of pad electrodes 12 made of aluminum or the like is disposed on it, as shown in FIG. 1. The pad electrodes 12 may be made of aluminum and copper, or may be made of copper. The pad electrodes 12, each connected with an electronic device (not shown) formed in the semiconductor substrate 10, are electrically independent from each other and disposed together in a predetermined region away from dicing lines DL. In the device shown in FIGS. 1 and 2, each pad electrode 12 connected to a respective electronic device is connected to bump electrode 22 for external connection formed on the back surface of the semiconductor substrate 10. Four connections between the pad electrodes 12 and bump electrodes 22 are made through an opening 10A formed in the semiconductor substrate 10.

A horizontal shape of the semiconductor substrate 10 is square or approximately square, for example.

The pad electrodes 12 are covered with an insulation film 13 made of a silicon nitride film or the like that makes a passivation film. A supporter 15 is bonded to the top surface of the semiconductor substrate 10 through an adhesive layer 14 made of organic resin or the like. The supporter 15 is made of glass in this embodiment. However, it may be made of other material such as resin or silicon.

An opening 10A is formed in the semiconductor substrate 10 in a region overlapping the predetermined region where the plurality of pad electrodes 12 is disposed. That is, the plurality of pad electrodes 12 is disposed together in the opening 10A. The opening 10A is thoroughly surrounded by the semiconductor substrate 10, and is formed in a region not overlapping the dicing line DL. The opening 10A is horizontally shaped in a square with an edge that is 200 μm-500 μm long, for example. Further, it is preferable that the opening 10A is formed at a location around or approximately around a center of the semiconductor device, in other words, at a location away from the dicing lines DL. An insulation film 16 made of a silicon oxide film or the like is formed in the opening 10A and extending over a back surface of the semiconductor substrate 10.

An opening 17 is formed in the insulation films 11 and 16 in a region overlapping a portion of each of the pad electrodes 12. The opening 17 is horizontally shaped in a square with an edge that is 20 μm-80 μm long, for example.

There is disposed a wiring layer 18 that is connected with each of the pad electrodes 12 through corresponding each of the openings 17. The wiring layer 18 is formed to have a desired pattern. The wiring layer 18 is made of aluminum, for example. However, it may be made of other material such as one including copper, for example, or may be made of copper. The wiring layer 18 may be also used as a light-shielding film for the electronic device (not shown). The wiring layer 18 is covered with an insulation film 19 made of a silicon oxide film or the like and a protection film 20 made of organic resin or the like.

An opening that exposes a portion of the wiring layer 18 is provided in the insulation film 19 and the protection film 20 that overlap the wiring layer 18. A plating layer 21 made of gold plating, for example, is disposed on the wiring layer 18 in the opening. A bump electrode 22 made of solder, gold or the like is disposed on the plating layer 21. The plating layer 21 serves to connect the wiring layer 18 to the bump electrode 22 favorably.

Since a distance between the pad electrode 12 and the dicing line DL is greater in the semiconductor device according to the embodiment of this invention than in the conventional semiconductor device, the corrosion of the pad electrode 12 due to the invasion of water or the like from the side surface of the semiconductor device occurs less likely, even when a cut surface is formed by a dicing blade (not shown) on the semiconductor substrate 10 at the dicing.

Also because the distance between the pad electrode 12 and the dicing line DL is greater in the semiconductor device according to the embodiment than in the conventional semiconductor device, there can be prevented a connection failure between the pad electrode 12 and the wiring layer 18 due to an impact caused when the dicing blade touches the semiconductor substrate 10 during the dicing.

That is, the semiconductor device according to the embodiment of this invention does not require forming a groove similar to the groove 123 that extends partway through the thickness of the supporter 115 along the dicing line DL in the conventional semiconductor device in order to prevent the connection failure between the pad electrode 112 and the wiring layer 118.

Thus, an area of the semiconductor substrate 10 required to form the semiconductor device according to the embodiment is reduced by an amount of area required to form the groove 123 in the conventional semiconductor device, and the number of semiconductor devices obtained from a wafer form of the semiconductor substrate 10 is increased compared with the conventional semiconductor device. In addition, eliminating the need to form the groove as required in the conventional semiconductor device makes the manufacturing process simpler and reduces the manufacturing cost as a result.

Since the semiconductor device according to the embodiment does not have a slanted plane on its side surface similar to a sidewall of the opening 110A in the conventional semiconductor device, an area of the back surface can be increased compared with the conventional semiconductor device. As a result, mechanical strength of the semiconductor substrate 10 is increased compared with that of the conventional semiconductor device, and mechanical strength of the semiconductor device at the time of assembly is also increased. When the wiring layer 18 is also used as the light-shielding film for the electronic device (not shown), a light-shielding capability can be increased as an area and flexibility in the patterning of the wiring layer 18 is increased compared with those of the conventional semiconductor device.

In addition, the reliability of the semiconductor device is improved because the pad electrodes 12 are disposed inside the guard ring GR that is formed along a periphery of the semiconductor substrate 10.

Figure 2:
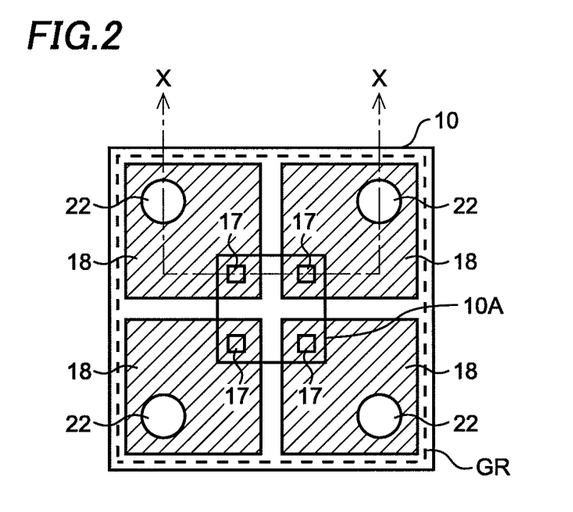
FIG. 2 is a plan view showing the semiconductor device according to the embodiment of this invention.

The structure described above looks as shown in FIG. 2, when looked from a back surface-side of the semiconductor substrate 10. The cross-sectional view of the section X-X in FIG. 2 corresponds to FIG. 1. FIG. 2 shows only the semiconductor substrate 10, the openings 10A, the openings 17, the bump electrodes 22 and the dicing lines DL out of the components shown in FIG. 1 and the rest of the components are omitted, for the sake of convenience of the explanation.

Next, a method of manufacturing the semiconductor device having the structure as described above will be explained referring to the drawings. FIGS. 3 through 7 are cross-sectional views of the semiconductor device, and primarily show a region in which one semiconductor device out of a plurality of the semiconductor devices formed in the wafer form of the semiconductor substrate 10 is to be formed.

Figure 3:
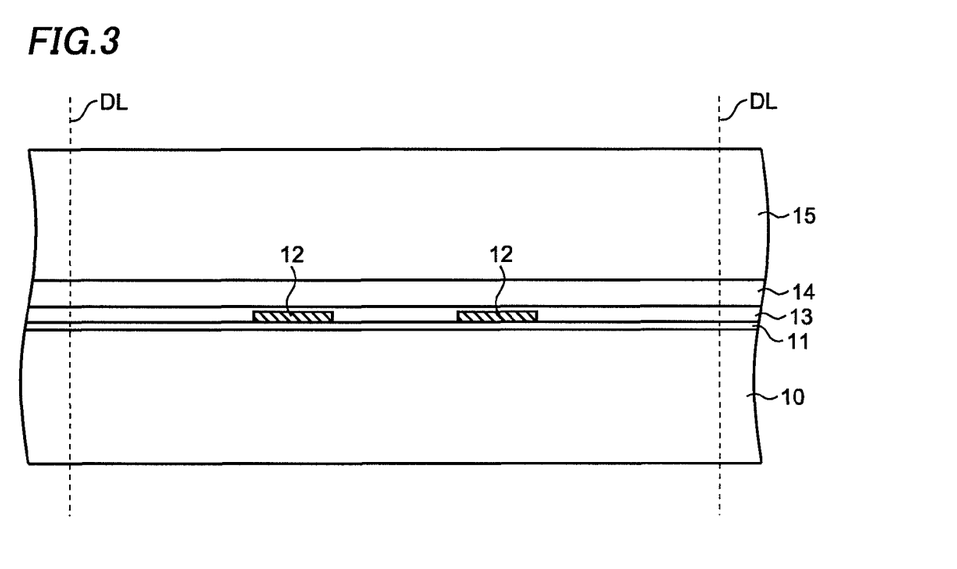
FIG. 3 is a cross-sectional view showing the semiconductor device and its manufacturing method according to the embodiment of this invention.

First, there is provided a semiconductor substrate 10 made of a silicon substrate of a thickness of approximately 100-700 µm, for example, as shown in FIG. 3. Electronic devices (not shown), such as transistors, are formed in the top surface of the semiconductor substrate 10. The electronic devices are covered with the insulation film 11 made of the BPSG film or the like.

Next, the plurality of pad electrodes 12 that is electrically connected with the electronic devices is formed on the insulation film 11 in the predetermined region away from the dicing lines DL.

It is preferable that the predetermined region is located around or approximately around a center of a region where the semiconductor device is to be formed. A case in which the predetermined region is located around the center of the region where the semiconductor device is to be formed is described hereafter.

Next, the passivation film 13 made of the silicon nitride film or the like is formed to cover the pad electrodes 12 and the insulation film 11. After that, the adhesive layer 14 is formed on the passivation film 13 by applying adhesive including organic resin or the like, and the supporter 15 is bonded to the top surface of the semiconductor substrate 10 through the adhesive layer 14. The supporter 15 is made of a material transparent to light or a material non-transparent to light, and is about 100-700 µm thick, for example. The supporter 15 is made of glass, for example, in the explanation of the embodiment. However, it may be made of other material such as resin or silicon.

Figure 4:
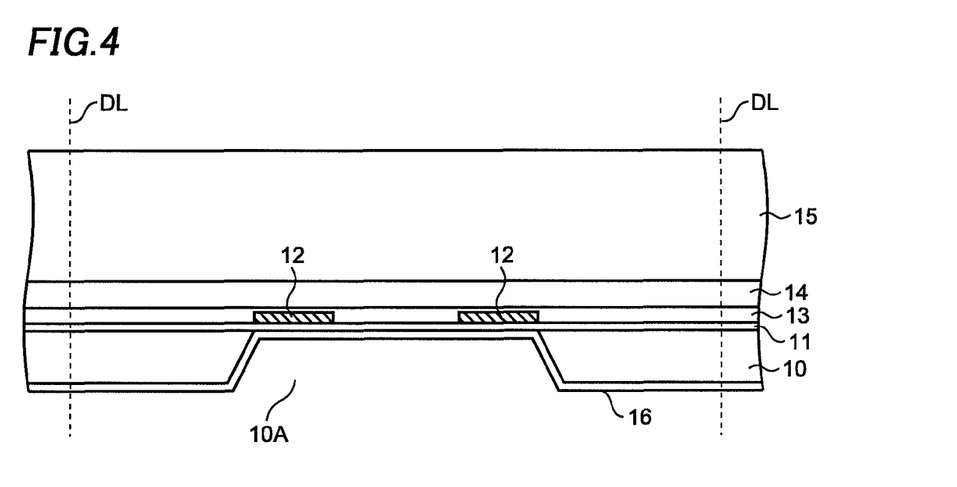
FIG. 4 is a cross-sectional view showing the semiconductor device and its manufacturing method according to the embodiment of this invention.

Next, back-grinding is performed on the semiconductor substrate 10 bonded to the supporter 15 until the thickness of the semiconductor substrate 10 is reduced to 50-150 µm, for example, as shown in FIG. 4.

The semiconductor substrate 10 in the region overlapping the predetermined region where the plurality of pad electrodes 12 is formed is removed by etching. As a result, the opening 10A is formed in the semiconductor substrate 10 in the region overlapping the predetermined region where the plurality of pad electrodes 12 is formed. That is, the plurality of pad electrodes 12 is in the opening 10A. The opening 10A is formed in the region that does not overlap the dicing line DL. The insulation film 11 is exposed in the bottom of the opening 10A.

It is preferable that a sidewall of the semiconductor substrate 10 in the opening 10A is formed to be tapered down toward the supporter 15. By doing so, coverage of each of the layers formed to cover the semiconductor substrate 10 and the supporter 15 in subsequent process steps is improved.

Next, the insulation film 16 made of the silicon oxide film or the like is formed to cover the inside of the opening 10A and the back surface of the semiconductor substrate 10.

Figure 5:
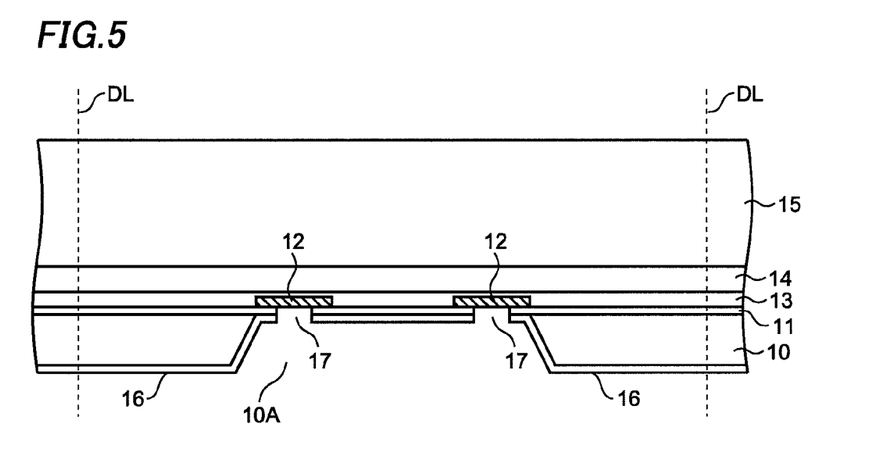
FIG. 5 is a cross-sectional view showing the semiconductor device and its manufacturing method according to the embodiment of this invention.

After that, a portion of the insulation films 11 and 16 overlapping in the opening 10A is etched off to form the opening 17 that exposes a portion of each of the pad electrodes 12, as shown in FIG. 5.

Figure 6:
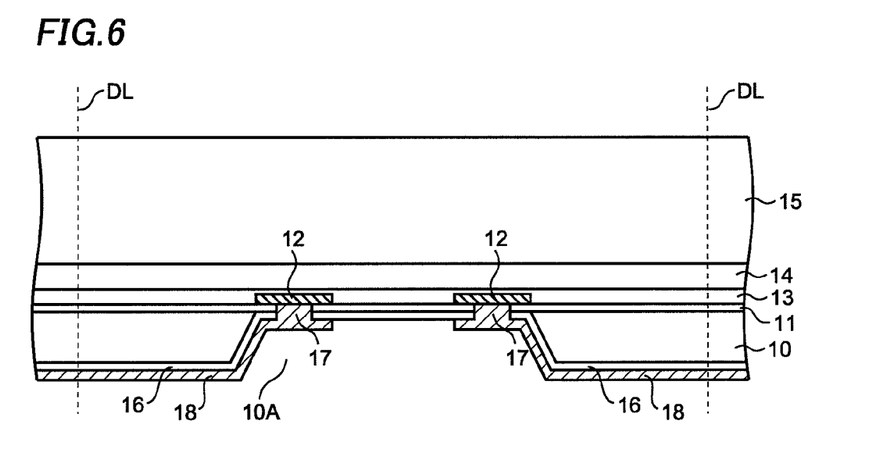
FIG. 6 is a cross-sectional view showing the semiconductor device and its manufacturing method according to the embodiment of this invention.

Next, there is formed the wiring layer 18 that is connected with the pad electrode 12 through the opening 17 in the insulation films 11 and 16 and extending from the inside of the opening 10A in the semiconductor substrate 10 to over the back surface of the semiconductor substrate 10, as shown in FIG. 6. The wiring layer 18 is made of aluminum, for example. However, it may be made of other material such as one including copper, for example, or may be made of copper.

Figure 7:
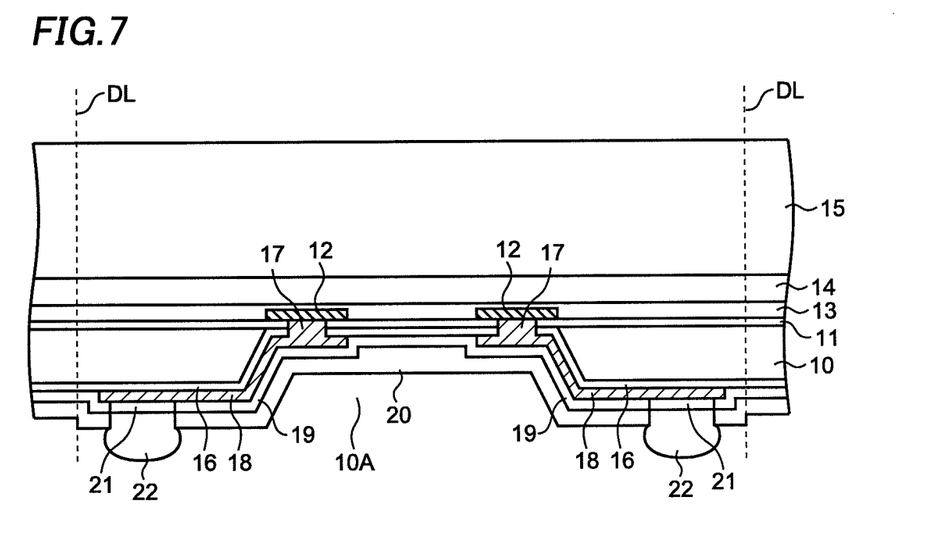
FIG. 7 is a cross-sectional view showing the semiconductor device and its manufacturing method according to the embodiment of this invention.

Next, the wiring layer 18 is shaped into the desired pattern by etching using a mask (not shown) formed by photolithography or the like, as shown in FIG. 7. The wiring layer 18 does not overlap the dicing line DL, and an edge of the wiring layer 18 is located on an inner side (a side closer to the opening 10A) than the dicing line DL in the example shown in the drawing.

After that, the insulation film 19 made of the silicon oxide film or the like is formed to cover the wiring layer 18. The opening to expose the portion of the wiring layer 18 is formed in the insulation film 19, and the plating layer 21 made of gold plating, for example, and connected with the wiring layer 18 is formed in the opening. Furthermore, the protection film 20 made of organic resin or the like is formed to cover the insulation film 19 and the plating layer 21. The opening to expose the plating layer 21 is formed in the protection film 20, and the bump electrode 22 made of solder, gold or the like is formed on the plating layer in the opening. The plating layer 21 is horizontally shaped in a circle or in other shape such as a rectangle or a polygon, and the bump electrode 22 formed on it reflects the shape of the plating layer 21 and is also formed in the shape of the circle or in the other shape such as the rectangle or the polygon. The plating layer 21 and the bump electrode 22 are depicted to be formed in the shape of the circle in the drawing.

Figure 8:
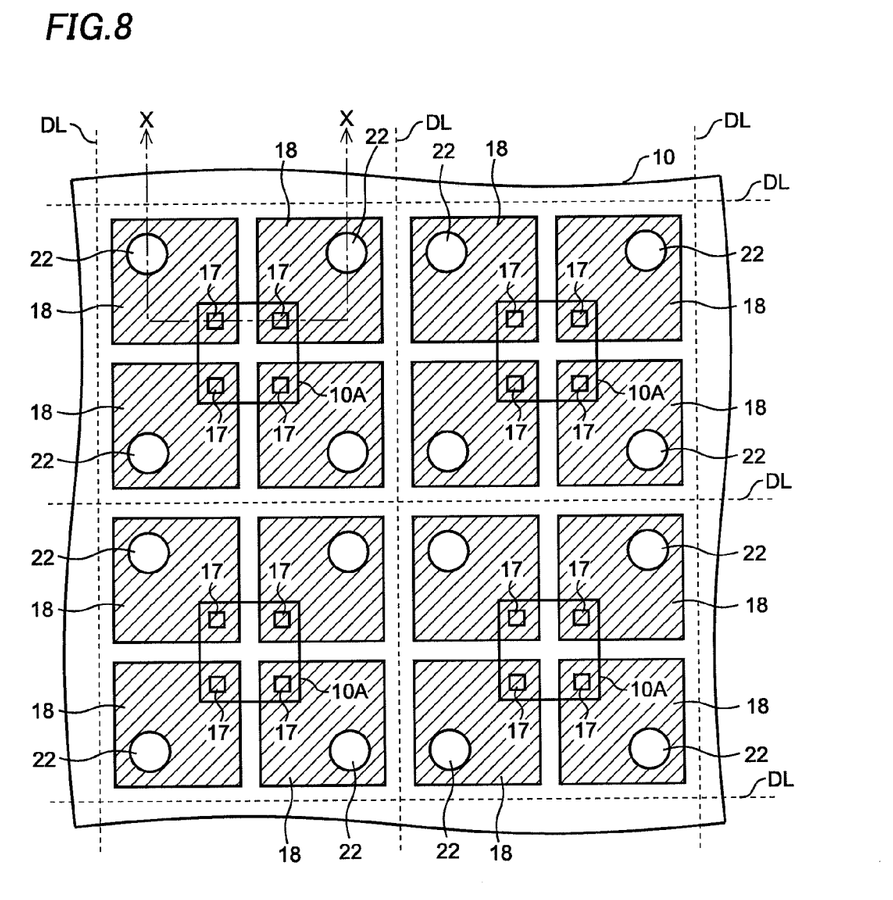
FIG. 8 is a plan view showing the semiconductor device and its manufacturing method according to the embodiment of this invention.

Relative locations of openings 10A in the semiconductor substrate 10, the opening 17 in the insulation films 11 and 16 and the dicing lines DL described above are as shown in FIG. 8 when looked from the back surface-side of the semiconductor substrate 10. A section X-X in FIG. 8 corresponds to the cross-sectional views shown in FIGS. 3 through 7. FIG. 8 shows only the semiconductor substrate 10, the openings 10A, the openings 17, the wiring layers 18, the bump electrodes 22 and the dicing lines DL out of the components shown in FIGS. 3 through 7, and the rest of the components are omitted for the sake of convenience of the explanation.

After that, the stacked layer structure including the semiconductor substrate 10 and the supporter 15 are separated into a plurality of the semiconductor devices by dicing along the dicing lines DL. Since the pad electrodes 12 are located far away from the dicing lines DL, the corrosion of the pad electrodes 12 due to the invasion of water or the like from the side surface of the semiconductor device occurs less likely, even when the cut surface is formed by the dicing blade on the semiconductor substrate 10 and the supporter 15 at the dicing. Also, there can be prevented a connection failure between the pad electrode 12 and the wiring layer 18 due to the impact caused when the dicing blade touches the semiconductor substrate 10.

The relative locations of the openings 17 in the insulation films 11 and 16, the wiring layers 18 and the bump electrodes 22 are not limited to those shown in FIG. 2 and FIG. 8, and may be those in modified examples as described below. FIGS. 9 through 13 are outline plan views of semiconductor devices according to the modified examples of the embodiment of this invention. Cross-sectional structures of the semiconductor devices according to the modified examples are similar to the cross-sectional structure shown in FIG. 1, and their manufacturing method is similar to the manufacturing method shown in FIGS. 3 through 7. Thus, explanations on them are omitted.

Figure 9:
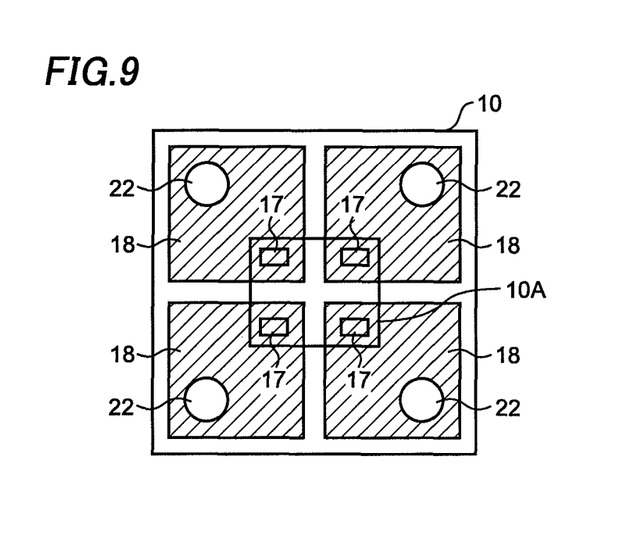
FIG. 9 is a plan view showing the semiconductor device according to the embodiment of this invention.

The pad electrode 12 may be formed to have a shape of a rectangle as sown in FIG. 9, for example.

Figure 10:
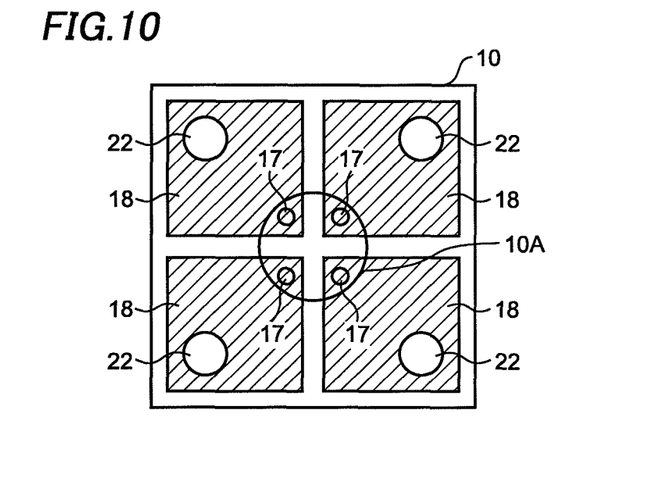
FIG. 10 is a plan view showing the semiconductor device according to the embodiment of this invention.

Also, the openings 10A and the openings 17 may be formed in a circular shape as shown in FIG. 10 in order to minimize an area of the region in which the openings 10A in the semiconductor substrate 10 and the openings 17 in the insulation films 11 and 16 are formed.

Figure 11:
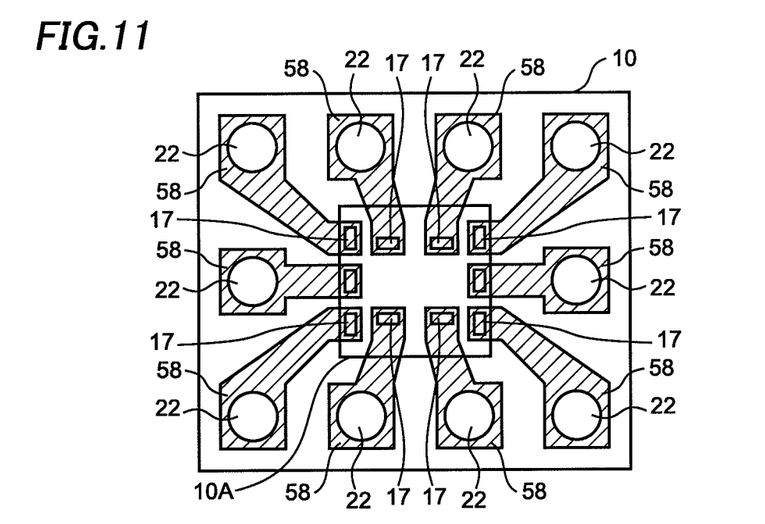
FIG. 11 is a plan view showing the semiconductor device according to the embodiment of this invention.

Also, when ten each of the openings 17 in the insulation films 11 and 16 and the bump electrodes 22 are disposed on the square-shaped semiconductor substrate 10, each of the bump electrodes 22 may be connected with corresponding each of the pad electrodes 12 in the opening 10A in the semiconductor substrate 10 through corresponding each of the openings 17 in the insulation films 11 and 16 by a wiring layer 58 formed of the same material and by the same manufacturing method as the wiring layer 18, as shown in FIG. 11. In this example, some of the rectangle-shaped openings 17 are disposed in the square-shaped opening 10A along an edge of the opening 10A in the semiconductor substrate 10 while some other openings 17 are disposed along an orthogonal edge.

Figure 12:
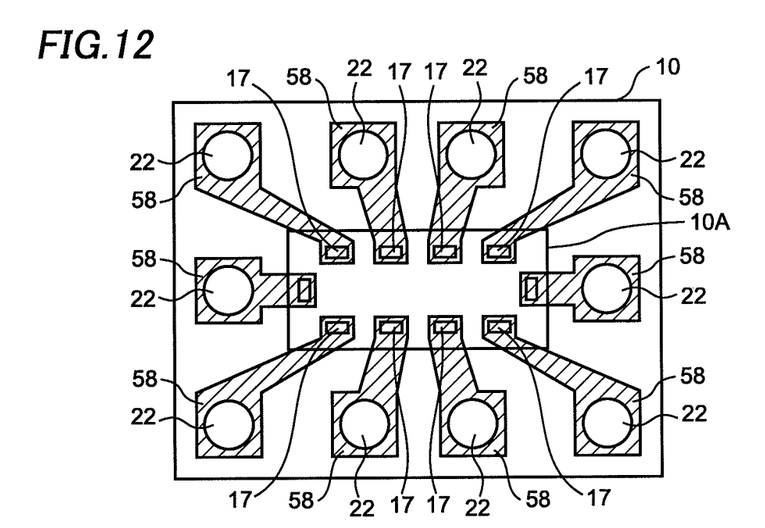
FIG. 12 is a plan view showing the semiconductor device according to the embodiment of this invention.

Or, ten each of the openings 17 in the insulation films 11 and 16 and the bump electrodes 22 may be disposed on the rectangle-shaped semiconductor substrate 10 as shown in FIG. 12.

Figure 13:
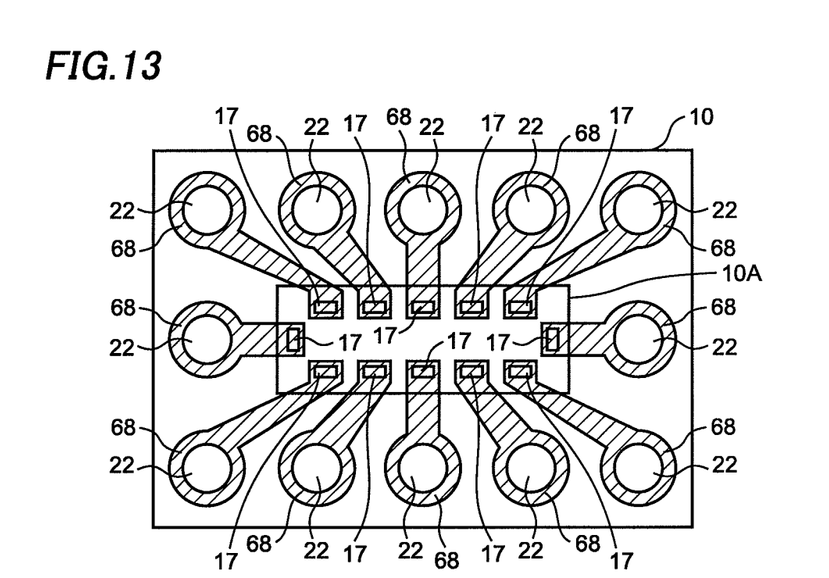
FIG. 13 is a plan view showing the semiconductor device according to the embodiment of this invention.

Or, twelve each of the openings 17 in the insulation films 11 and 16 and the bump electrodes 22 may be disposed on the rectangle-shaped semiconductor substrate 10 as shown in FIG. 13. In this case, the wiring layer 68 formed of the same material and by the same manufacturing method as the wiring layer 18 preferably has a circular shape in the region where the bump electrode 22 is formed in order to increase flexibility in patterning the wiring layer.

It is apparent that this invention is not limited to the embodiment described above and may be modified within the scope of the invention.

For example, although the plating layer 21 is formed between the bump electrode 22 and the wiring layer 18, 58 or 68 in the embodiment, the plating layer 21 is not necessarily formed and the bump electrode 22 may be directly connected with the wiring layer 18, 58 or 68. When the wiring layer 18, 58 or 68 is made of copper, for example, the material gives a good electrical connection by its nature even when the bump electrode 22 is directly connected with the wiring layer 18, 58 or 68.

Also, the bump electrodes 22 are not necessarily formed in the embodiment described above. For example, conductive paste (not shown) including silver or the like may be formed instead of the bump electrode 22.

Also, an opening to expose the pad electrode 12 may be formed in the supporter 15 and a wiring layer or an electrode connected with the pad electrode 12 through the opening may be formed in the embodiment described above. With this structure, another of the semiconductor device can be stacked on top of the supporter 15 so that two of the semiconductor devices are electrically connected through the wiring layer or the electrode described above.

Also, the supporter 15 may be removed after dicing the stacked layer structure including the semiconductor substrate 10 and the supporter 15 in the embodiment described above. That is, the embodiment may be applied to the semiconductor device that does not include the supporter 15 in the finished product. In this case, the insulation film 13 may be formed thick enough to have a sufficient mechanical strength to replace the supporter 15. In addition, a protection film may be formed over the insulation film 13. A material of the protection film is not specified, and may be made of organic resin, for example.

In addition, an opening to expose the pad electrode 12 may be formed in the insulation film 13 or in the insulation film 13 and the protection film thereon, and a wiring layer or an electrode connected with the pad electrode 12 through the opening may be formed on the insulation film 13 or on the protection film. With this structure, another of the semiconductor device can be stacked on top of the insulation film 13 or on top of the protection film so that two of the semiconductor devices are electrically connected through the wiring layer or the electrode described above.

According to the embodiment of this invention, forming the groove along the dicing line as required in the conventional art is no longer necessary, since the pad electrodes are not disposed in the periphery of the semiconductor device, i.e. in the vicinity of the dicing line. As a result, the area of the semiconductor substrate required to form the semiconductor device is reduced compared with the conventional art, and the number of the semiconductor devices obtained from a wafer form of the semiconductor substrate is increased. In addition, eliminating the need to form the groove makes the manufacturing process simpler and reduces the manufacturing cost as a result. Furthermore, the reliability of the semiconductor device is improved because the pad electrodes are disposed inside the guard ring.

What is claimed is:

1. A semiconductor device comprising:
   a separated semiconductor die having an opening formed therein, the opening not being separated into two or more openings;
   a supporter bonded to a top surface of the separated semiconductor die so as to cover the opening;
   an adhesive layer boding the supporter to the top surface of the separated semiconductor die;
   a plurality of pad electrodes disposed in the opening so as to be on the supporter; and
   a plurality of wiring layers electrically connected to corresponding pad electrodes in the opening.

2. The semiconductor device of claim 1, wherein the opening is disposed around a center of the separated semiconductor die.

3. The semiconductor device of claim 1, wherein the separated semiconductor die has a rectangular shape.

4. The semiconductor device of claim 1, wherein the opening has four corners in plan view of the semiconductor device, and four pad electrodes are in the opening so that a pad electrodes is disposed adjacent each corner.

5. A semiconductor device comprising:
   a separated semiconductor die having an opening formed therein; the opening not being separated into two or more openings;
   an insulation film disposed on the separated semiconductor die so as to cover the opening;
   a plurality of pad electrodes disposed in the opening so as to be disposed on the insulation film; and
   a plurality of wiring layers electrically connected to corresponding pad electrodes in the opening.

6. The semiconductor device of claim 5, wherein the opening is disposed around a center of the separated semiconductor die.

7. A method of manufacturing a semiconductor device comprising:
   providing a semiconductor substrate;
   forming a plurality of pad electrodes in a predetermined region of the semiconductor substrate on a top surface of the semiconductor substrate;
   bonding a supporter to the top surface of the semiconductor substrate using an adhesive;
   forming an opening in the semiconductor substrate at the predetermined region so as to penetrate through the semiconductor substrate;
   forming a plurality of wiring layers on a bottom surface of the semiconductor substrate so that the wiring layers are electrically connected to corresponding pad electrodes in the opening; and
   dicing a stacked layer structure comprising the semiconductor substrate and the supporter along a dicing line to produce a semiconductor device, wherein, after the dicing has been completed to produce the semiconductor device, the entire opening remains in the produced semiconductor device without being cut.

8. The method of claim 7, wherein the predetermined region and the opening are formed around a center of the semiconductor substrate.

9. The method of claim 7, further comprising forming an insulation film to cover the semiconductor substrate and the pad electrodes and removing the supporter after the dicing.

10. The method of claim 7, wherein the opening is defined by a closed boundary in plan view of the semiconductor die.

11. The method of claim 9, wherein the predetermined region and the opening are formed around a center of the semiconductor substrate.

12. A semiconductor device comprising:
   a separated semiconductor die having a front surface and a back surface and having an opening penetrating through the separated semiconductor die, the opening not being separated into two or more openings;
   an insulating body disposed on the front surface of the separated semiconductor die and covering the opening of the separated semiconductor die;
   a plurality of pad electrodes disposed in the opening of the semiconductor die so as to be on the insulating body; and
   a plurality of wiring layers electrically connected to corresponding pad electrodes and disposed on the back surface of the separated semiconductor die,
   wherein, in plan view of the semiconductor device, the wiring layers extend radially from the opening of the separated semiconductor die toward corresponding edges of the separated semiconductor die.

* * * * *